United States Patent
Parizy et al.

(10) Patent No.: US 10,955,469 B2
(45) Date of Patent: Mar. 23, 2021

(54) METHOD FOR ESTIMATING FAILURE RATE AND INFORMATION PROCESSING DEVICE

(71) Applicant: FUJITSU LIMITED, Kawasaki (JP)

(72) Inventors: Matthieu Parizy, Meguro (JP); Tatsuya Yamamoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/585,730

(22) Filed: Sep. 27, 2019

(65) Prior Publication Data

US 2020/0116786 A1 Apr. 16, 2020

(30) Foreign Application Priority Data

Oct. 16, 2018 (JP) .............................. JP2018-195337

(51) Int. Cl.
| | |
|---|---|
| *G01R 31/30* | (2006.01) |
| *G01R 31/317* | (2006.01) |
| *G06F 16/2453* | (2019.01) |
| *G06N 7/00* | (2006.01) |
| *G06N 20/00* | (2019.01) |
| *G01R 31/3177* | (2006.01) |

(52) U.S. Cl.
CPC ... *G01R 31/31718* (2013.01); *G01R 31/3177* (2013.01); *G06F 16/24539* (2019.01); *G06N 7/00* (2013.01); *G06N 20/00* (2019.01)

(58) Field of Classification Search
CPC .......... G01R 31/31718; G01R 31/3177; G06F 16/24539; G06N 7/00; G06N 20/00
See application file for complete search history.

(56) References Cited

U.S. PATENT DOCUMENTS

| | | | |
|---|---|---|---|
| 5,414,645 A | 5/1995 | Hirano | |
| 6,901,347 B1* | 5/2005 | Murray | G06F 11/008 |
| | | | 700/108 |
| 2013/0305081 A1* | 11/2013 | Agnihotram | G05B 23/0262 |
| | | | 714/2 |
| 2015/0039244 A1* | 2/2015 | Bernstein | G01M 99/007 |
| | | | 702/34 |
| 2018/0218547 A1* | 8/2018 | Kalyanaraman | G05B 23/0283 |

FOREIGN PATENT DOCUMENTS

| | | |
|---|---|---|
| JP | 5-180730 | 7/1993 |
| JP | 2004-252972 | 9/2004 |

* cited by examiner

*Primary Examiner* — Samir W Rizk
(74) *Attorney, Agent, or Firm* — Staas & Halsey LLP

(57) ABSTRACT

A non-transitory computer-readable recording medium has stored therein a program that causes a computer to execute a process, the process including: generating, based on search history information indicating history of search in a component search device with respect to feature values of a component, appearance frequency information indicating frequencies at which the feature values appear in the search history information; generating, based on the appearance frequency information, weighting information in which weights are associated with the feature values; executing learning on accumulated failure record information to build a failure estimation model for estimating a failure rate of the component; and estimating the failure rate of the component by using the built failure estimation model.

7 Claims, 13 Drawing Sheets

FIG. 3

| COMPONENT NAME | FEATURE VALUES (SPECIFICATIONS, ATTRIBUTES) | | | | 210 |
| --- | --- | --- | --- | --- | --- |
| | MATERIAL | FREQUENCY | TERMINAL ELECTRODE | WITHSTAND VOLTAGE | |
| CAPACITOR | Ni | 100 Hz | | 3.3 | |
| CRYSTAL OSCILLATOR | Sn | | | | |

FIG. 4

| PERSON IN CHARGE | COMPONENT NAME | FEATURE VALUE AS SEARCH REQUIREMENT | 220 |
| --- | --- | --- | --- |
| A | CAPACITOR | MATERIAL + TERMINAL ELECTRODE | 221 |
| A | CAPACITOR | MATERIAL | 222 |
| A | CAPACITOR | TERMINAL ELECTRODE | 223 |
| B | CRYSTAL OSCILLATOR | WITHSTAND VOLTAGE | |
| B | CRYSTAL OSCILLATOR | WITHSTAND VOLTAGE | |

FIG. 5

| COMPONENT NAME | FEATURE VALUES (SPECIFICATIONS, ATTRIBUTES) | | | | NUMBER OF FAILURES |
| --- | --- | --- | --- | --- | --- |
| | MATERIAL | FREQUENCY | TERMINAL ELECTRODE | WITHSTAND VOLTAGE | |
| CAPACITOR | Ni | 100 Hz | | 3.3 | ... |
| CRYSTAL OSCILLATOR | Sn | | | | ... |
| | | | | | ... |

| COMPONENT NAME | PURCHASE AMOUNT |
| --- | --- |
| CAPACITOR | ... |
| CRYSTAL OSCILLATOR | ... |

| COMPONENT NAME | MATERIAL | TERMINAL ELECTRODE | FREQUENCY | WITHSTAND VOLTAGE |
|---|---|---|---|---|
| CAPACITOR | 50% | 50% | 0 | 0 |
| CRYSTAL OSCILLATOR | 0 | 0 | 0 | 100% |

| COMPONENT NAME | MATERIAL | TERMINAL ELECTRODE | FREQUENCY | WITHSTAND VOLTAGE |
|---|---|---|---|---|
| CAPACITOR | — | *** | — | — |
| CRYSTAL OSCILLATOR | — | — | *** | — |

262

| COMPONENT NAME | MATERIAL | TERMINAL ELECTRODE | FREQUENCY | WITHSTAND VOLTAGE |
|---|---|---|---|---|
| CAPACITOR | 0 | 1 | 0 | 0 |
| CRYSTAL OSCILLATOR | 0 | 0 | 1 | 0 |

| COMPONENT NAME | MATERIAL | TERMINAL ELECTRODE | FREQUENCY | WITHSTAND VOLTAGE |
|---|---|---|---|---|
| CAPACITOR | 1 | 0 | 0 | 0 |
| CRYSTAL OSCILLATOR | 0 | 0 | 1 | 1 |

PLEASE CONFIRM HIGHLIGHTED SEGMENT.

172

| COMPONENT NAME | CAPACITOR |
|---|---|
| MATERIAL | 0 |
| TERMINAL ELECTRODE | 1 |
| FREQUENCY | 0 |
| WITHSTAND VOLTAGE | 0 |

173
YOU HAVE OFTEN PERFORMED SEARCH USING THIS FEATURE VALUE, BUT THIS FEATURE VALUE IS LESS RELEVANT TO FAILURE.

CONFIRM BUTTON — 174

METHOD FOR ESTIMATING FAILURE RATE AND INFORMATION PROCESSING DEVICE

CROSS-REFERENCE TO RELATED APPLICATION

This application is based upon and claims the benefit of priority of the prior Japanese Patent Application No. 2018-195337, filed on Oct. 16, 2018, the entire contents of which are incorporated herein by reference.

FIELD

The embodiments discussed herein are related to a method for estimating a failure rate and an information processing device.

BACKGROUND

It has been important to estimate a failure of a component to be selected in the design of an electronic device in order to inhibit the failure after the shipment of a product. Thus, a probability that the failure occurs has been estimated based on past component failure cases.

Related techniques are disclosed in, for example, Japanese Laid-open Patent Publication No. 2004-252972 and Japanese Laid-open Patent Publication No. 05-180730.

The number of cases related to component failures is small, and the amount of data related to the component failures is small. Thus, a model for accurately estimating a failure rate of a component using a small amount of data is requested. When the model is built using a small amount of data, a weight is assigned to a parameter (feature of a component) related to a failure, and machine learning or the like is to be executed based on information indicating failure records.

The weight is manually given to the feature of the component by an expert having knowledge, and thus the number of processes is large.

SUMMARY

According to an aspect of the embodiments, a non-transitory computer-readable recording medium has stored therein a program that causes a computer to execute a process, the process including: generating, based on search history information indicating history of search in a component search device with respect to feature values of a component, appearance frequency information indicating frequencies at which the feature values appear in the search history information; generating, based on the appearance frequency information, weighting information in which weights are associated with the feature values; executing learning on accumulated failure record information to build a failure estimation model for estimating a failure rate of the component; and estimating the failure rate of the component by using the built failure estimation model.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 is a diagram illustrating an example of a component feature database according to the first embodiment;

FIG. 4 is a diagram illustrating an example of a search log database according to the first embodiment;

FIG. 5 is a diagram illustrating an example of a failure record database according to the first embodiment;

FIG. 6 is a diagram illustrating an example of a purchase record database according to the first embodiment;

FIG. 8 is a diagram illustrating an example of an appearance frequency table according to the first embodiment;

FIG. 9 is a diagram illustrating an example of a failed component table according to the first embodiment;

FIG. 16 is a diagram illustrating an example of a hint table according to the second embodiment;

FIG. 17 is a first diagram illustrating an example of output of a hint according to the second embodiment.

DESCRIPTION OF EMBODIMENTS

First Embodiment

Figure 1:
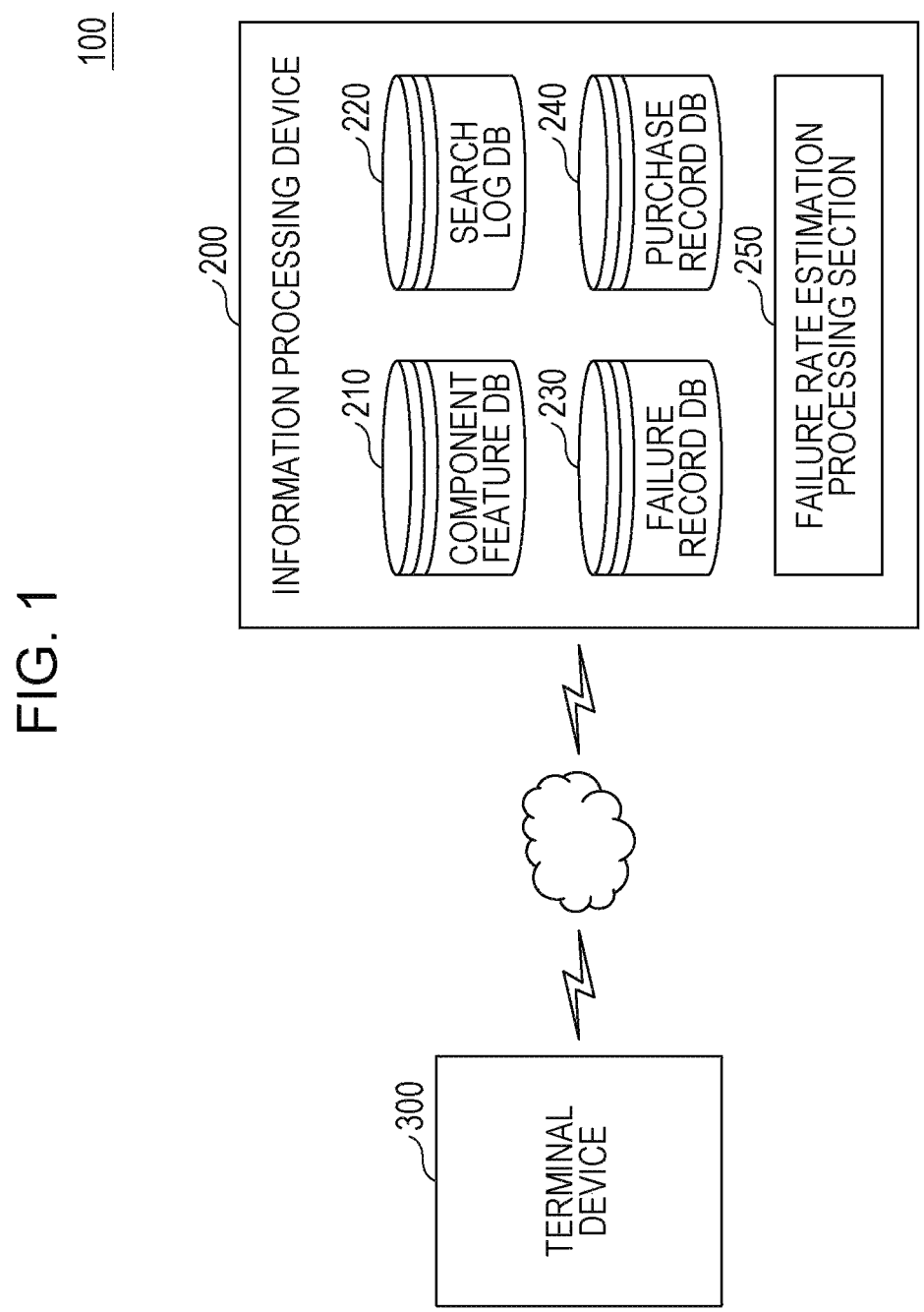
FIG. 1 is a diagram illustrating an example of a configuration of a failure rate estimation system according to a first embodiment.

A first embodiment is described with reference to FIGS. 1 to 13. FIG. 1 is a diagram illustrating an example of a configuration of a failure rate estimation system according to the first embodiment.

A failure rate estimation system 100 according to the first embodiment includes an information processing device 200 and a terminal device 300.

In the failure rate estimation system 100 according to the first embodiment, the information processing device 200 calculates a failure rate of a component upon receiving input information specifying the component from the terminal device 300 and outputs the calculated failure rate to the terminal device 300. In this case, the failure rate indicates a probability that the component fails within a certain time period.

The information processing device 200 according to the first embodiment includes a component feature database (DB) 210, a search log database 220, a failure record database 230, a purchase record database 240, and a failure rate estimation processing section 250.

In the component feature database 210, information on components is stored. In the first embodiment, information on a component is also referred to as component information, and an item associated with a component name in the component information is also referred to as feature value of the component.

In the search log database 220, information indicating a search history and including a search key input to search the component information is stored. In the following description, information indicating a search history of the component information is also referred to as search history information.

In the failure record database 230, information on a failed component among purchased components is accumulated and stored. In the following description, information on a failed component is also referred to as failure record information. In the purchase record database 240, information on a component purchased by, for example, a certain company, a business facility, or the like is stored. In the following description, information on a purchased component is also referred to as purchase record information. The databases are described later in detail.

The failure rate estimation processing section 250 according to the first embodiment references the failure record database 230 and the purchase record database 240 to build a model for estimating a failure of a specified component. In other words, the failure rate estimation processing section 250 generates the model for calculating a failure rate of a specified component. In the following description, the model for estimating a failure of a component is also referred to as failure estimation model.

In addition, the failure rate estimation processing section 250 according to the first embodiment references the component feature database 210 and the failure record database 230 to generate information indicating relationships between feature values of a component and a failure.

Furthermore, the failure rate estimation processing section 250 references the search log database 220 to generate, for each of the feature values of the component, information indicating frequencies (appearance frequencies) at which the feature values appear as search keys in the search history information.

Furthermore, the failure rate estimation processing section 250 assigns a weight to each of the feature values of the component based on the generated information indicating the relationships and the generated information indicating the appearance frequencies.

Then, the failure rate estimation processing section 250 gives the weights assigned to the feature values of the component to the failure estimation model and executes the machine learning to rebuild the failure estimation model.

For example, the failure rate estimation processing section 250 according to the first embodiment automatically assigns the weights to the feature values of the component based on the frequencies at which the feature values of the component appear in the search history information and the information indicating the relationships between the feature values and the failure. Then, the failure rate estimation processing section 250 gives the weights to the failure estimation model and executes the machine learning to rebuild the failure estimation model.

Traditionally, weighting has been manually executed by an expert having knowledge. In the first embodiment, however, the weighting is automatically executed and the number of processes to be executed to build the failure estimation model may be reduced.

In the example illustrated in FIG. 1, the databases are included in the information processing device 200, but are not limited to this. The databases according to the first embodiment may be included in a device other than the information processing device 200. Alternatively, one or more of the databases may be included in the information processing device 200.

Figure 2:
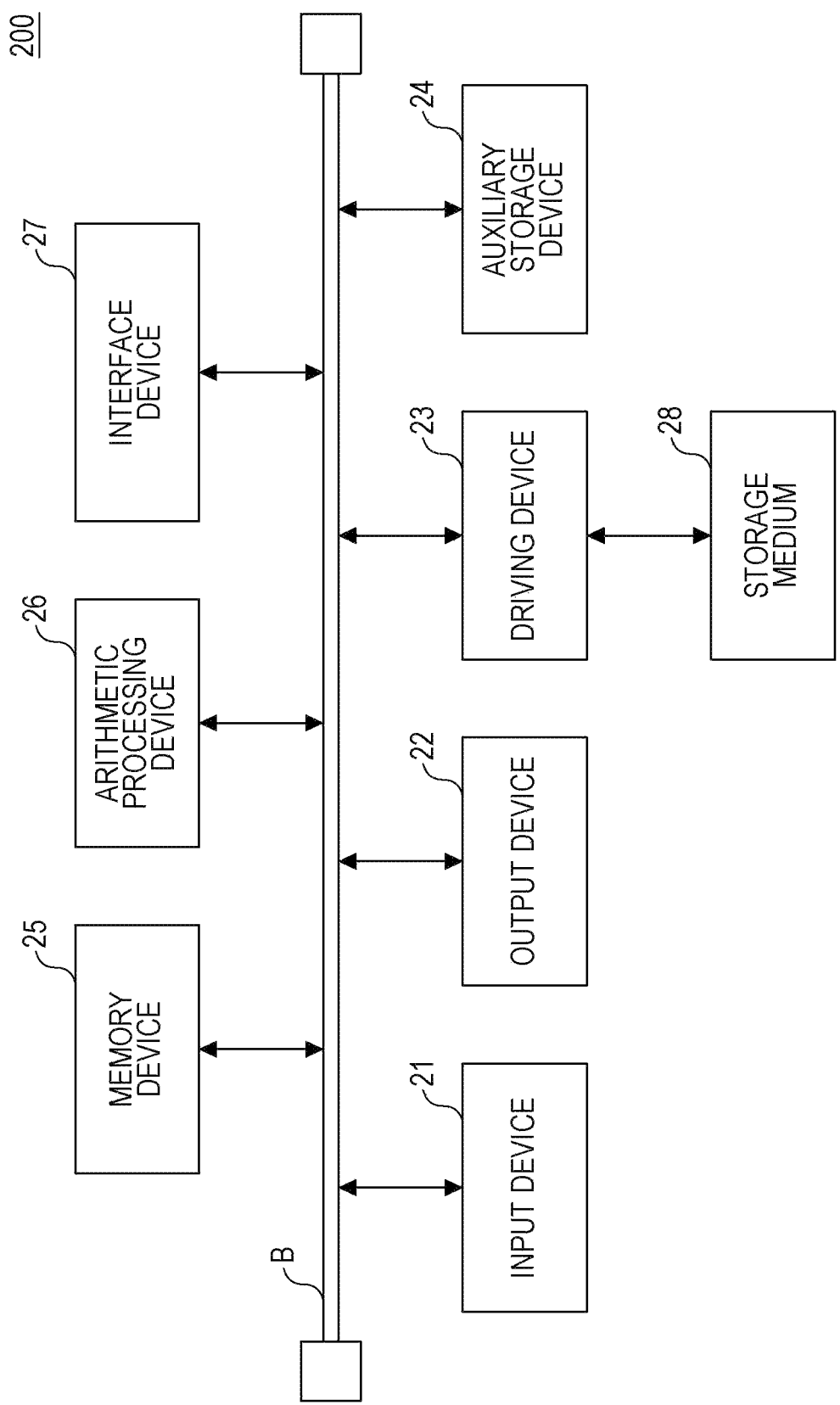
FIG. 2 is a diagram illustrating an example of a hardware configuration of an information processing device according to the first embodiment.

The information processing device 200 according to the first embodiment is described below. FIG. 2 is a diagram illustrating an example of a hardware configuration of the information processing device according to the first embodiment.

The information processing device 200 according to the first embodiment includes an input device 21, an output device 22, a driving device 23, an auxiliary storage device 24, a memory device 25, an arithmetic processing device 26 (also referred to as processor), and an interface device 27, which are coupled to each other via a bus B.

The input device 21 is used to input various information and is implemented by, for example, a keyboard, a pointing device, or the like. The output device 22 is used to output various information and is implemented by, for example, a display or the like. The interface device 27 includes a local area network (LAN) card and is used to couple the information processing device 200 to a network.

A failure rate estimation program for implementing the failure rate estimation processing section 250 is one or more of various programs for controlling the information processing device 200. The failure rate estimation program may be stored in a storage medium 28, and the storage medium 28 storing the failure rate estimation program may be distributed and provided. Alternatively, the failure rate estimation program may be downloaded from the network and provided. The storage medium 28 storing the failure rate estimation program may be any of various types of storage media. The storage medium 28 storing the failure rate estimation program may be a storage medium, which is a compact disc read-only memory (CD-ROM), a flexible disk, a magneto-optical disc, or the like and configured to optically, electrically, or magnetically store information, or may be a semiconductor memory, which is a read-only memory (ROM), a flash memory, or the like and configured to electrically store information.

When the storage medium 28 storing the failure rate estimation program is set in the driving device 23, the failure rate estimation program is installed in the auxiliary storage device 24 from the storage medium 28 via the driving device 23. The failure rate estimation program downloaded from the network is installed in the auxiliary storage device 24 via the interface device 27.

The auxiliary storage device 24 stores the installed failure rate estimation program and stores results calculated by the information processing device 200, various files, various data, and the like. The memory device 25 reads the failure rate estimation program from the auxiliary storage device 24 upon the activation of the information processing device 200 and stores the read failure rate estimation program. Then, the arithmetic processing device 26 implements various processes (described later) in accordance with the failure rate estimation program stored in the memory device 25.

Next, the databases according to the first embodiment are described with reference to FIGS. 3 to 6. FIG. 3 is a diagram illustrating an example of the component feature database according to the first embodiment.

The component feature database 210 according to the first embodiment includes a component name item and a feature item as information items. In the component feature database 210. In the component feature database 210, the component name item is associated with the feature item.

Values of the "component name" item indicate the names of components. The "feature" item is associated with multiple items included in information indicating specifications of the components or the like. In the following description, the multiple items associated with the "feature" item are referred to as feature values.

In the example illustrated in FIG. 3, feature values associated with a component name "capacitor" include feature values "material", "frequency", "terminal electrode", and "withstand voltage". A material indicated by the feature value "material" of the component name "capacitor" is Ni, while a frequency indicated by the feature value "frequency" of the component name "capacitor" is 100 Hz.

The component information according to the first embodiment is information including the values of the "component name" item, the feature values that are values of the "feature" item, and values indicated by the feature values in the component feature database 210.

The feature values included in the feature item associated with the component name item are not limited to the example illustrated in FIG. 3. The feature values included in the feature item associated with the component name item may vary for each component name.

FIG. 4 is a diagram illustrating an example of the search log database according to the first embodiment. The search log database 220 according to the first embodiment includes a "person in charge" item, a "component name" item, and a "search requirement" item as information items. In the search log database 220, the "person in charge" item is associated with the other items.

Each of values indicated in the "person in charge" item indicates information identifying a user who has entered a search requirement and searched for a component. For example, each of the values indicated in the "person in charge" item indicates the name of a user who has searched for a component. The user may be a person in charge of selecting components, for example.

Each of values indicated in the "search requirement" item is a feature value of the component, which is entered as a search requirement (search key) in order to search for a component. In the first embodiment, one feature value may be entered as a search key or a combination of multiple feature values may be entered as a search key.

The search history information according to the first embodiment is information including values of the "person in charge" item, the "component name" item, and the "search requirement" item.

In the example illustrated in FIG. 4, it is apparent that a person A in charge has specified the component name "capacitor" and performed a search using the feature value "material" and the feature value "terminal electrode" as search keys.

A component search according to the first embodiment is executed, for example, by searching the component feature database 210 using, search keys, a component name that is information specifying a component, and a feature value serving as a search requirement.

In the first embodiment, for example, a component search device including the component feature database 210 may receive an input search key and search the component information within the component feature database 210. The information processing device 200 according to the first embodiment may function as the component search device.

FIG. 5 is a diagram illustrating an example of the failure record database according to the first embodiment. The failure record database 230 according to the first embodiment includes a "component name" item, a "feature" item, and a "number of failures" item as information items.

Each of values indicated in the "number of failures" item indicates the number of failed components indicated by a component name associated with the item. The information items included in the failure record database 230 are not limited to the example illustrated in FIG. 5. The failure record database 230 may include a failure type item as an information item, as well as the aforementioned information items.

The failure record information according to the first embodiment is information including values indicated in the "component name" item, the "feature" item, and the "number of failures" item.

FIG. 6 is a diagram illustrating an example of the purchase record database according to the first embodiment. The purchase record database 240 according to the first embodiment includes a "component name" item and a "purchase amount" item as information items. In the purchase record database 240, the "component name" item and the "purchase amount" item are associated with each other.

Each of values indicated in the "purchase amount" item indicates an amount (number) of purchased components indicated by a component name associated with the item. For example, each of the values indicated in the "purchase amount" item may indicate the number of components purchased by a business facility, a company, or the like that uses the failure rate estimation system 100.

The information items included in the purchase record database 240 are not limited to the example illustrated in FIG. 6. The purchase record database 240 may include a material item indicating a material associated with a component name, for example.

Figure 7:
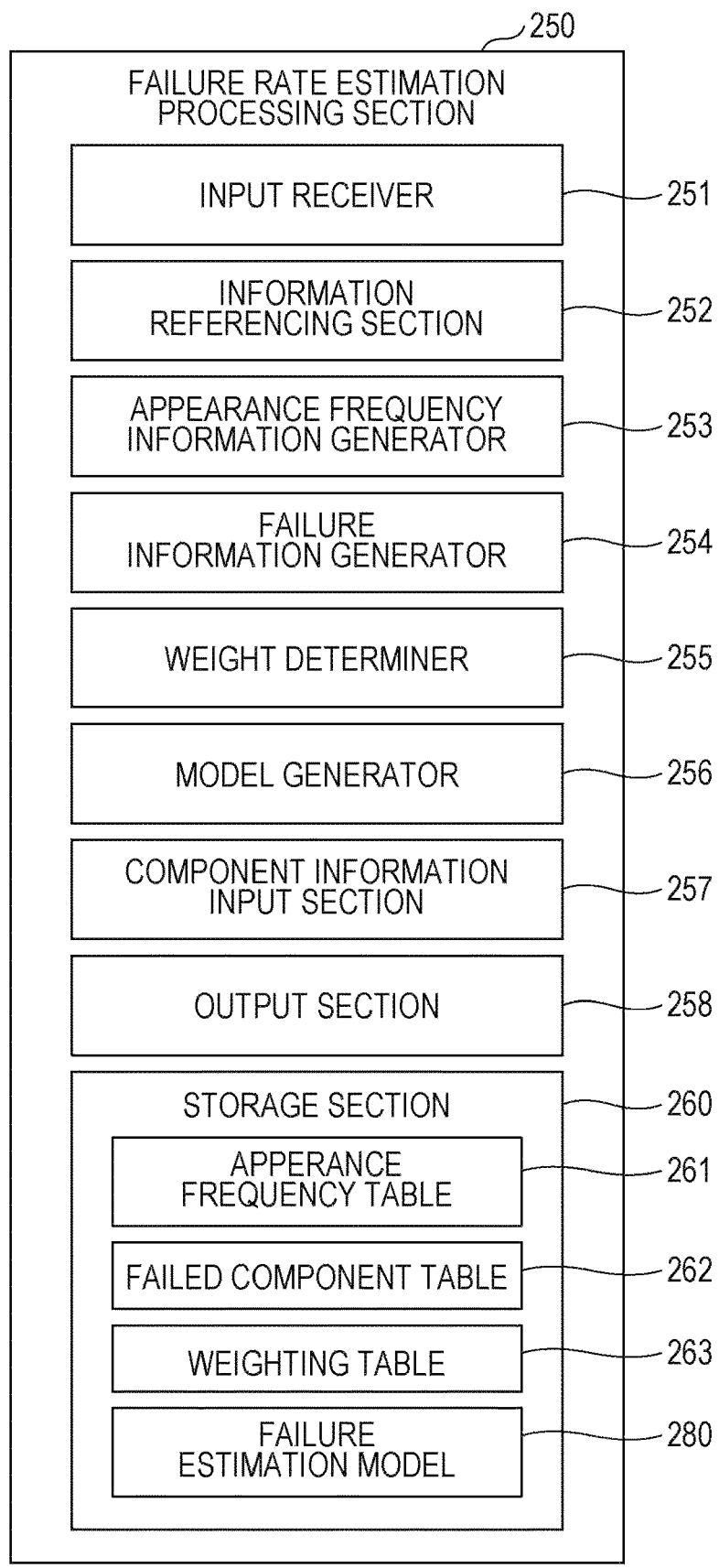
FIG. 7 is a diagram describing functions of a failure rate estimation processing section according to the first embodiment.

Next, functions of the failure rate estimation processing section 250 included in the failure rate estimation system 100 according to the first embodiment are described with reference to FIG. 7. FIG. 7 is a diagram describing the functions of the failure rate estimation processing section according to the first embodiment.

The failure rate estimation processing section 250 according to the first embodiment is implemented by causing the arithmetic processing device 26 to read and execute the failure rate estimation program stored in the memory device 25 or the like.

The failure rate estimation processing section 250 according to the first embodiment includes an input receiver 251, an information referencing section 252, an appearance frequency information generator 253, a failure information generator 254, a weight determiner 255, a model generator 256, a component information input section 257, an output section 258, and a storage section 260.

The input receiver 251 receives various information input to the information processing device 200. For example, the input receiver 251 receives an input component name and an input search requirement. For example, the input receiver 251 receives an input component name for which a failure rate is to be calculated.

The information referencing section 252 references the databases and acquires information. For example, the information referencing section 252 references the component feature database 210, the search log database 220, and the failure record database 230.

The information referencing section 252 references the search log database 220, and the appearance frequency information generator 253 calculates, for each of component names indicated in the search log database 220, frequencies at which feature values associated with the component name appear in the search history information stored in the search log database 220. Then, the appearance frequency information generator 253 generates an appearance frequency table 261 and causes the generated appearance frequency table 261 to be held in the storage section 260. In the appearance frequency table 261, each of the component names is associated with the frequencies at which feature values of the component name appear. The generation of the appearance frequency table 261 by the appearance frequency information generator 253 is described later in detail.

The information referencing section 252 references the failure record database 230, and the failure information generator 254 determines whether bias in feature values of each of component names in the failure record information is statistically significant. Then, the failure information generator 254 generates a failed component table 262 indicating results of the determination and causes the failed component table 262 to be held in the storage section 260. The generation of the failed component table 262 by the failure information generator 254 is described later in detail.

Using the appearance frequency table 261 and the failed component table 262, the weight determiner 255 performs weighting of feature values associated with each of the component names, generates a weighting table 263 indicating results of the weighting, and causes the weighting table 263 to be held in the storage section 260. The generation of the weighting table 263 by the weight determiner 255 is described later in detail.

The model generator 256 generates, from the failure record database 230 and the weighting table 263, a failure estimation model 280 for calculating a failure rate of a component and causes the failure estimation model 280 to be held in the storage section 260.

In other words, the model generator 256 according to the first embodiment executes the machine learning on the failure record information stored in the failure record database 230, thereby building the failure estimation model 280. In addition, the model generator 256 according to the first embodiment changes weights of the feature values based on the weighting table 263 and executes the machine learning on the failure record information, thereby rebuilding the failure estimation model 280.

When a component name for which a failure rate is to be calculated is input into the component information input section 257 from the terminal device 300, the component information input section 257 inputs the component name into the failure estimation model 280.

The failure estimation model 280 estimates the failure rate of the component name based on the input component name. In other words, the failure estimation model 280 according to the first embodiment serves as a failure rate estimator.

The failure estimation model 280 outputs a result indicating the estimated failure rate of the component name. The output section 258 outputs the failure rate of the component name, which is indicated in the result output by the failure estimation model 280, to the terminal device 300.

The storage section 260 is a storage region implemented by the auxiliary storage device 24 of the information processing device 200, the memory device 25 of the information processing device 200, or the like. The storage section 260 may include multiple storage regions.

Next, the appearance frequency table 261 according to the first embodiment is described with reference to FIG. 8. FIG. 8 is a diagram illustrating an example of the appearance frequency table according to the first embodiment.

The appearance frequency information generator 253 according to the first embodiment calculates, for each of component names, the ratio of the number of feature values included in the search history information stored in the search log database 220 with respect to the number of all feature values and provides results of calculating the ratios as the appearance frequency table 261.

Information items included in the appearance frequency table 261 are a "component name" item and "feature value" items. In the appearance frequency table 261, each of component names indicated in the "component name" item is associated with feature values indicated in the "feature value" items.

In the example illustrated in FIG. 8, the component name "capacitor" is associated with the feature values "material", "terminal electrode", "frequency", and "withstand voltage". In the search log database 220, search history information including the component name "capacitor" is search history information 221, 222, and 223 (refer to FIG. 4). A search requirement included in the search history information 221 includes two feature values "material" and "terminal electrode". A search requirement included in the search history information 222 includes only the feature value "material". A search requirement included in the search history information 223 includes only the feature value "terminal electrode".

Thus, the number of all the feature values included in the search history information including the component name "capacitor" is 4. In the search log database 220, the feature value "material" appears twice, and thus an appearance frequency of the feature value "material" is 50%. Similarly, in the search log database 220, an appearance frequency of the feature value "terminal electrode" of the component name "capacitor" is 50%, and an appearance frequency of the feature value "withstand voltage" of a component name "crystal oscillator" is 100%.

Next, the generation of the failed component table 262 according to the first embodiment is described with reference to FIG. 9. FIG. 9 is a diagram illustrating an example of the failed component table according to the first embodiment.

The failure information generator 254 according to the first embodiment determines whether the bias in the feature values included in the failure record information stored in the failure record database 230 is statistically significant. The failure information generator 254 holds a result of the determination as the failed component table 262.

For example, the failure information generator 254 may use a machine learning tool described in the R language or the like to evaluate the bias (distribution) in the feature values included in the failure record information stored in the failure record database 230 and output p-values. In addition, the failure information generator 254 outputs one asterisk for a feature value with a p-value of less than 0.05, outputs two asterisks for a feature value with a p-value of less than 0.01, and outputs three asterisks for a feature value with a p-value of less than 0.001.

Information items included in the failed component table 262 according to the first embodiment are a component name item and feature value items. In the failed component table 262, each of component names indicated in the component name item is associated with feature values indicated in the feature value items.

In the failed component table 262 illustrated in FIG. 9, three asterisks are associated with the feature value "terminal electrode" of the component name "capacitor". It is, therefore, apparent from the example of FIG. 9 that the feature value "terminal electrode" of the component name "capacitor" is likely to have a certain relationship with a failure of a capacitor indicated by the component name "capacitor".

Figure 10:
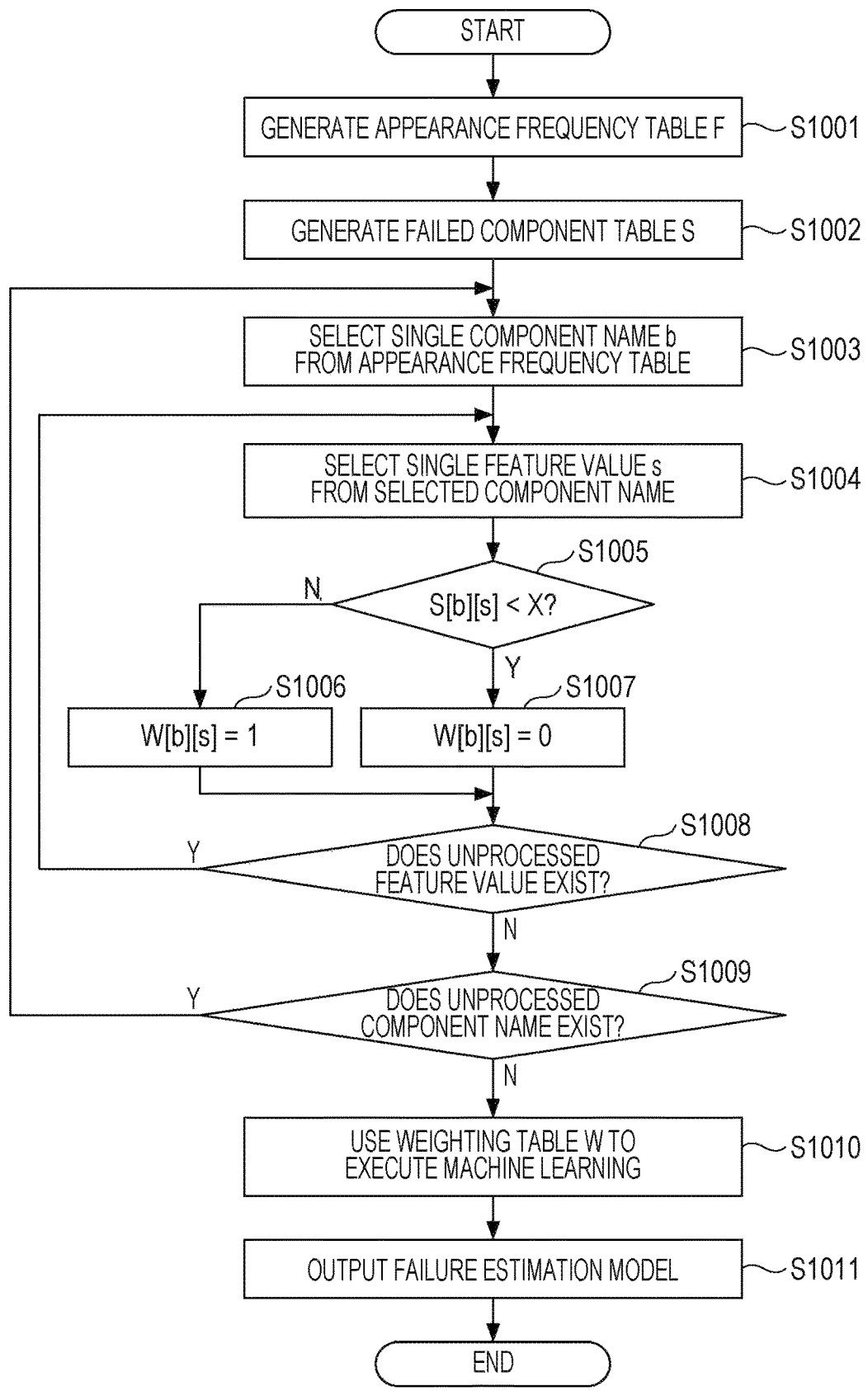
FIG. 10 is a first flowchart illustrating operations of the information processing device according to the first embodiment.

Next, operations of the information processing device 200 according to the first embodiment are described with reference to FIG. 10. FIG. 10 is a first flowchart illustrating the operations of the information processing device according to the first embodiment. The flowchart illustrated in FIG. 10 indicates a process of generating the weighting table 263 from the appearance frequency table 261 and the failed component table 262.

The process illustrated in FIG. 10 may be periodically executed or may be executed when a user of the failure rate estimation system 100 provides an instruction to execute the process.

In the failure rate estimation processing section 250 according to the first embodiment, the appearance frequency information generator 253 generates the appearance frequency table 261 (in step S1001). In the following description of FIG. 10, the appearance frequency table 261 is referred to as appearance frequency table F.

Subsequently, the failure rate estimation processing section 250 causes the failure information generator 254 to generate the failed component table 262 (in step S1002). In the following description of FIG. 10, the failed component table 262 is referred to as failed component table S. The generation of the appearance frequency table 261 and the failed component table 262 is described above.

Subsequently, the failure rate estimation processing section 250 causes the weight determiner 255 to select one component name from the appearance frequency table 261 (in step S1003). The component name selected in step S1003 is indicated by "b".

Subsequently, the weight determiner 255 selects one feature value from among feature values associated with the component name selected from the appearance frequency table 261 in step S1003 (in step S1004). The feature value selected in step S1004 is indicated by "s".

Next, the weight determiner 255 determines whether a value of the feature value "s" of the component name "b" in the failed component table S is smaller than a threshold X (in step S1005). The first embodiment assumes that the threshold X is set to 0.001 in advance.

When the concerned value is not smaller than the threshold X (or is equal to or larger than the threshold X) in step S1005, the weight determiner 255 sets the value of the feature value "s" of the component name "b" in the weighting table 263 to "1" (in step S1006). Then, the process proceeds to step S1008 described later. In the process illustrated in FIG. 10, the weighting table 263 is referred to as weighting table W. In this case, in the weighting table W, a weight of the feature value "s" of the component name "b" is "1".

When the concerned value is smaller than the threshold X in step S1005, the weight determiner 255 sets the value of the feature value "s" of the component name "b" in the weighting table W to "0" (in step S1007). Then, the process proceeds to step S1008 described later. In other words, the weight determiner 255 sets the weight of the feature value "s" of the component name "b" in the weighting table W to "0", and does not assign a weight to the feature value "s".

After step S1006 or S1007, the weight determiner 255 determines whether an unprocessed feature value "s" exists among feature values "s" associated with the component name "b" selected from the appearance frequency table F (in step S1008). When the unprocessed feature value "s" exists in step S1008, the weight determiner 255 causes the process to return to step S1004.

When the unprocessed feature value "s" does not exist in step S1008, the weight determiner 255 determines whether an unprocessed component name "b" exists in the appearance frequency table F (in step S1009). In other words, the weight determiner 255 determines whether all component names indicated in the appearance frequency table F have been selected.

When the unprocessed component name exists in step S1009, the weight determiner 255 causes the process to return to step S1003.

When the unprocessed component name does not exist in step S1009, the failure rate estimation processing section 250 causes the model generator 256 to use the weighting table W to execute the machine learning on the failure estimation model 280 (in step S1010). In other words, the failure rate estimation processing section 250 gives the weighting table W to the model generator 256 and executes the machine learning to relearn the failure record information in the machine learning, thereby rebuilding (relearning) the failure estimation model 280.

Subsequently, the model generator 256 outputs the rebuilt failure estimation model 280, causes the failure estimation model 280 to be held in the storage section 260 (in step S1011), and terminates the process.

Figures 11, 12:
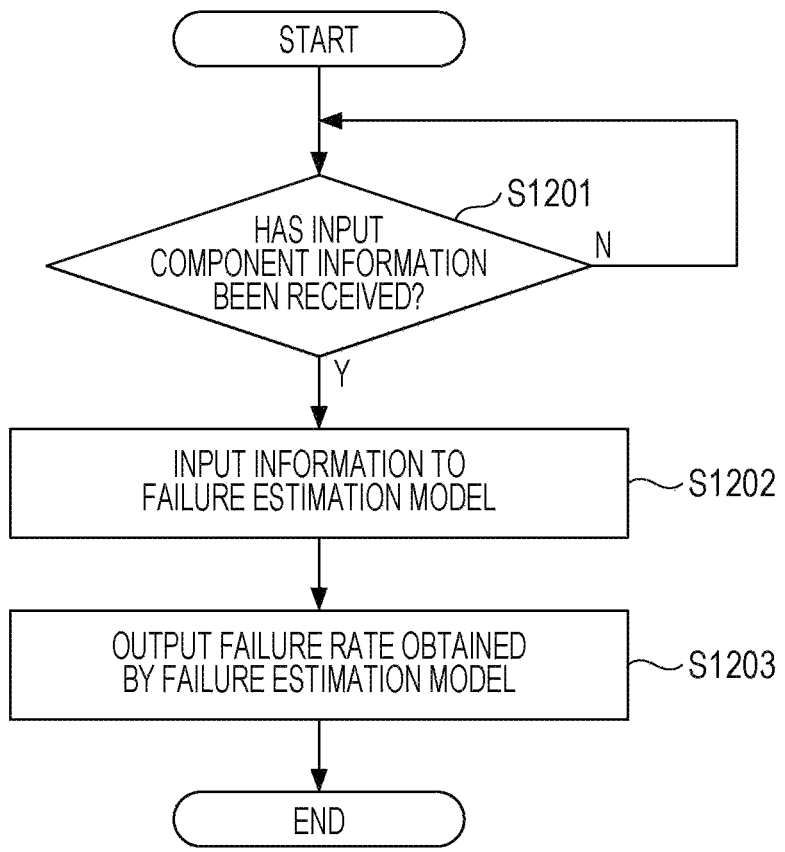
FIG. 11 is a diagram illustrating an example of a weighting table according to the first embodiment.
FIG. 12 is a second flowchart illustrating operations of the information processing device according to the first embodiment.

The weighting table 263 according to the first embodiment is described below in detail with reference to FIG. 11. FIG. 11 is a diagram illustrating an example of the weighting table according to the first embodiment.

Information items included in the weighting table 263 according to the first embodiment are a component name item and feature value items associated with the component name item. In the weighting table 263, a weight is assigned to each of the feature values.

For example, it is assumed that the weight determiner 255 selects the component name "capacitor" and the feature value "material" from the appearance frequency table 261. In this case, an asterisk is not associated with the feature value "material" of the component name "capacitor" in the failed component table 262.

Thus, the weight determiner 255 sets a weight of the feature value "material" of the component name "capacitor" to "0" in the weighting table 263.

In addition, it is assumed that the weight determiner 255 selects the component name "capacitor" and the feature value "terminal electrode" from the appearance frequency table 261. In this case, it is apparent that three asterisks are associated with the feature value "terminal electrode" of the component name "capacitor" and a p-value is equal to or larger than the threshold X in the failed component table 262.

Thus, the weight determiner 255 sets a weight of the feature value "terminal electrode" of the component name "capacitor" to "1" in the weighting table 263.

Although the first embodiment assumes that the threshold X is set to 0.001, the threshold X is not limited to this. The threshold X may be set to 0.01 or 0.05, for example. The information processing device 200 according to the first embodiment may prompt the user of the failure rate estimation system 100 to select the threshold X.

As described above, in the first embodiment, for example, it may be possible to automatically extract a feature value, which is significantly different among feature values of an actually failed component that are used as search keys when the component is searched for by the person in charge of selecting components, and to perform weighting of the extracted feature value.

Thus, in the first embodiment, the number of processes to be executed to perform weighting of feature values to be given to the failure estimation model 280 may be reduced.

According to the first embodiment, weights of feature values of a component may be given to the failure estimation model 280, and the failure estimation model 280 may be relearned. The weights may be changed based on appearance frequencies of the feature values that are used as search keys, Thus, according to the first embodiment, the model for accurately estimating a failure rate using a small amount of data may be built.

In the first embodiment, the weighting table 263 illustrated in FIG. 11 may be displayed in the terminal device 300 to prompt a person in charge of selecting components to look a feature value to which a weight has been assigned.

Next, operations of the information processing device 200 according to the first embodiment are described with reference to FIG. 12. FIG. 12 is a second flowchart illustrating the operations of the information processing device according to the first embodiment.

The flowchart illustrated in FIG. 12 indicates a process of causing the failure estimation model 280 to obtain a failure rate of a specified component and output the obtained failure rate when information specifying the component is input from the terminal device 300.

The failure rate estimation processing section 250 according to the first embodiment determines whether the input receiver 251 has received the input information specifying the component (in step S1201). The input information may indicate a component being considered to be newly purchased or the like.

When the input receiver 251 has not received the input information in step S1201, the failure rate estimation processing section 250 stands by until the input receiver 251 receives the input information.

When the input receiver 251 has received the input information in step S1201, the failure rate estimation processing section 250 causes the component information input section 257 to input the information specifying the component into the failure estimation model 280 (in step S1202).

Subsequently, the output section 258 acquires the failure rate of the component, which is calculated by using the failure estimation model 280, and outputs the acquired failure rate to the terminal device 300 (in step S1203). Then, the output section 258 terminates the process.

Figure 13:
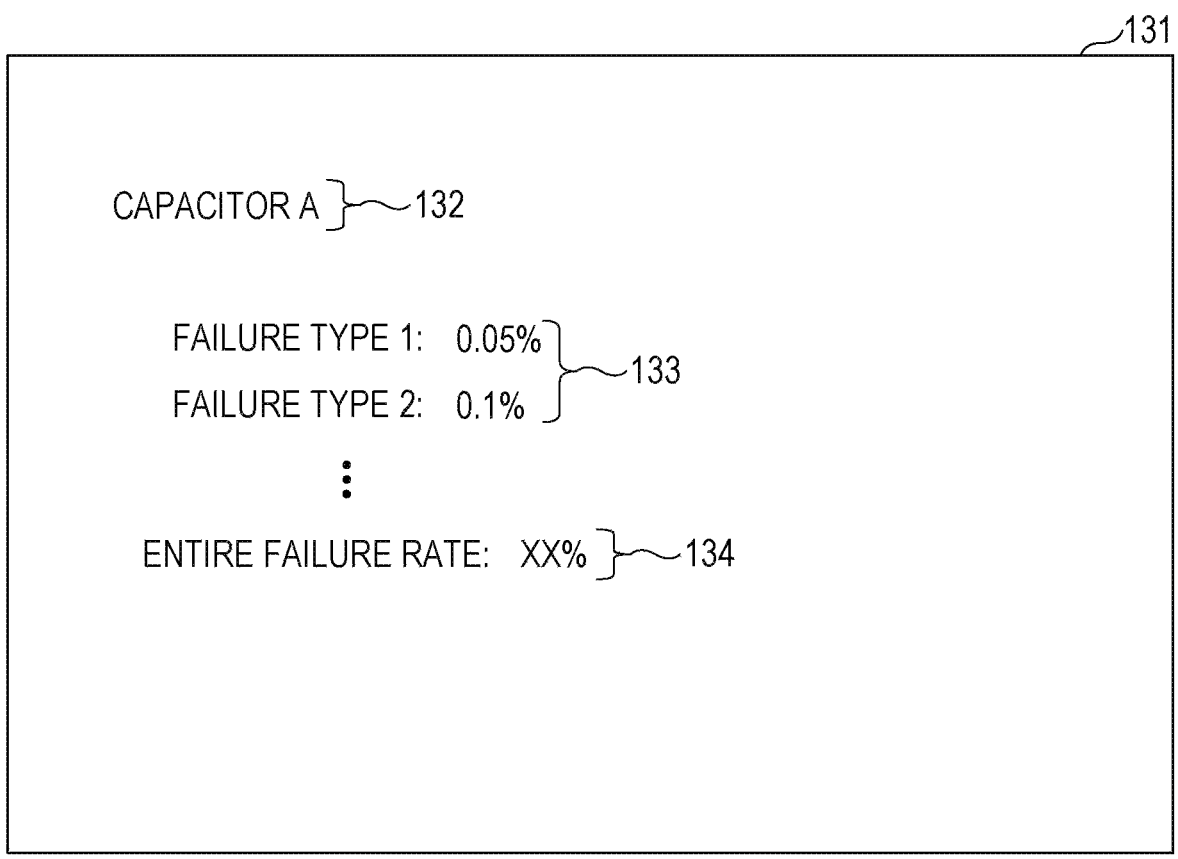
FIG. 13 is a diagram illustrating an example of output of a failure rate according to the first embodiment.

An example of the output of the failure rate by the failure estimation model 280 according to the first embodiment is described below with reference to FIG. 13. FIG. 13 is a diagram illustrating an example of the output of the failure rate according to the first embodiment.

A screen 131 illustrated in FIG. 13 is displayed in the terminal device 300, for example. On the screen 131, information 132 indicating a component name and information 133 and 134 indicating failure rates are displayed.

The information 132 indicating the component name is a "capacitor A". This capacitor A is, for example, a component being considered to be newly purchased.

The information 133 indicating failure rates includes types of failures of the capacitor A and values indicating probabilities that the failures occur. For example, it is apparent from the screen 131 that a probability that a failure of a failure type 1 occurs in the capacitor A is 0.05% and that a probability that a failure of a failure type 2 occurs in the capacitor A is 0.1%.

The information 134 includes a value indicating an entire failure rate of the capacitor A. The entire failure rate is the value obtained without classifying the failures that have occurred into the types, for example.

In the first embodiment, when the input receiver 251 receives information specifying a component, a failure rate of the specified component may be estimated by using the failure estimation model 280 learned based on weights given in the form of the weighting table 263.

Thus, according to the first embodiment, even when the amount of the accumulated failure record information is small, the accuracy of estimating a failure of a component may be improved.

Second Embodiment

Next, a second embodiment is described with reference to FIGS. 14 to 18. The second embodiment is different from the first embodiment in that supplementary information on a feature value is associated with the feature value based on results of weighting feature values. Thus, different features of the second embodiment from the first embodiment are described below, and sections having functions that are the same as or similar to those described in the first embodiment are indicated by the same reference symbols as those described in the first embodiment and will not be described in detail.

Figure 14:
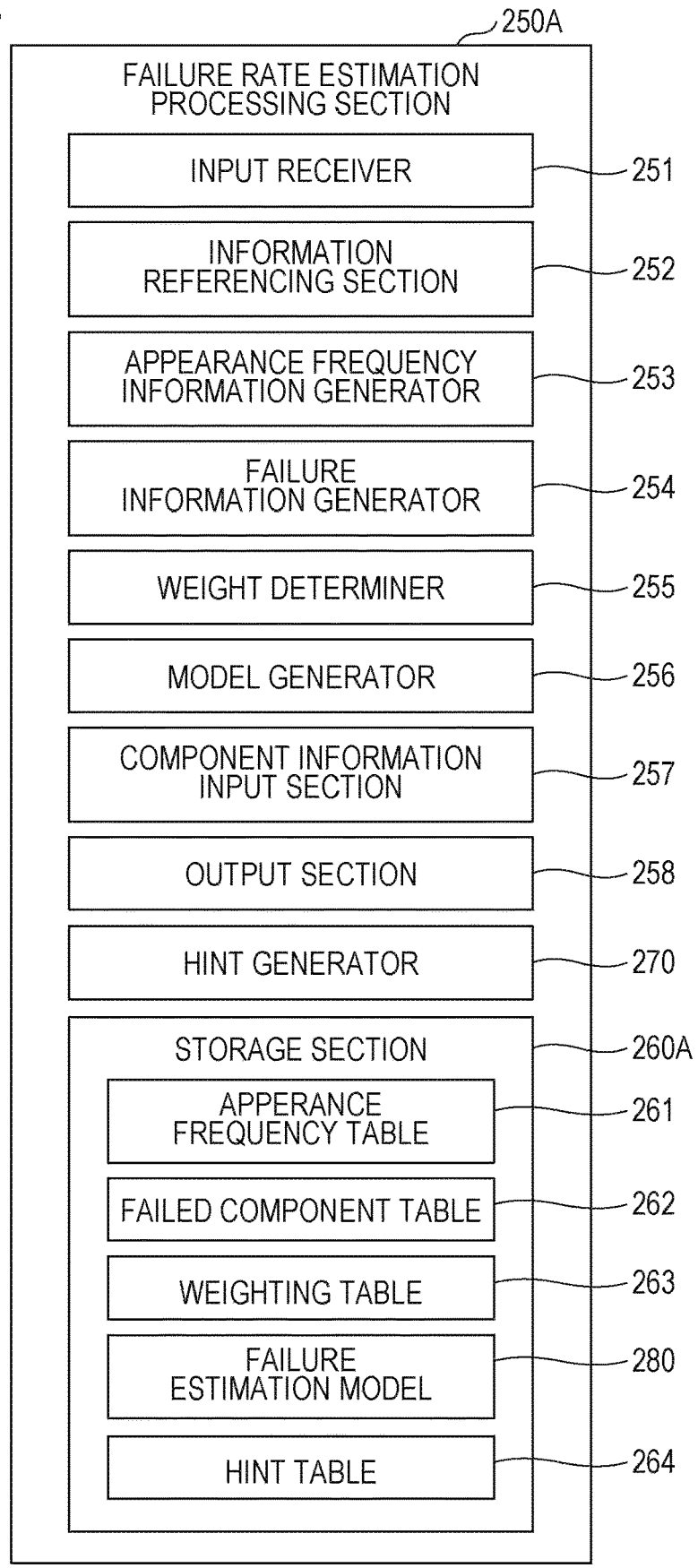
FIG. 14 is a diagram describing functions of a failure rate estimation processing section according to a second embodiment.

FIG. 14 is a diagram describing functions of a failure rate estimation processing section according to the second embodiment. The failure rate estimation processing section 250A according to the second embodiment includes the input receiver 251, the information referencing section 252, the appearance frequency information generator 253, the failure information generator 254, the weight determiner 255, the model generator 256, the component information input section 257, the output section 258, a storage section 260A, and a hint generator 270.

In the storage section 260A according to the second embodiment, the appearance frequency table 261, the failed component table 262, the weighting table 263, the failure estimation model 280, and a hint table 264 are held.

The hint generator 270 according to the second embodiment generates the hint table 264 from the appearance frequency table 261 and the weighting table 263. The hint table 264 according to the second embodiment is used to identify a feature value of a component, which appears as a search key at a relatively high frequency but is not significantly different in the failed component table 262, and identify a feature value of a component, which appears at a relatively low frequency but is significantly different in the failed component table 262. The hint table 264 is described later in detail.

The hint generator 270 according to the second embodiment generates, based on the hint table 264, supplementary information to be displayed in association with a feature value. The supplementary information according to the second embodiment is information describing a relationship between an appearance frequency of the feature value and a weight of the feature value. The supplementary information is described later in detail.

Figure 15:
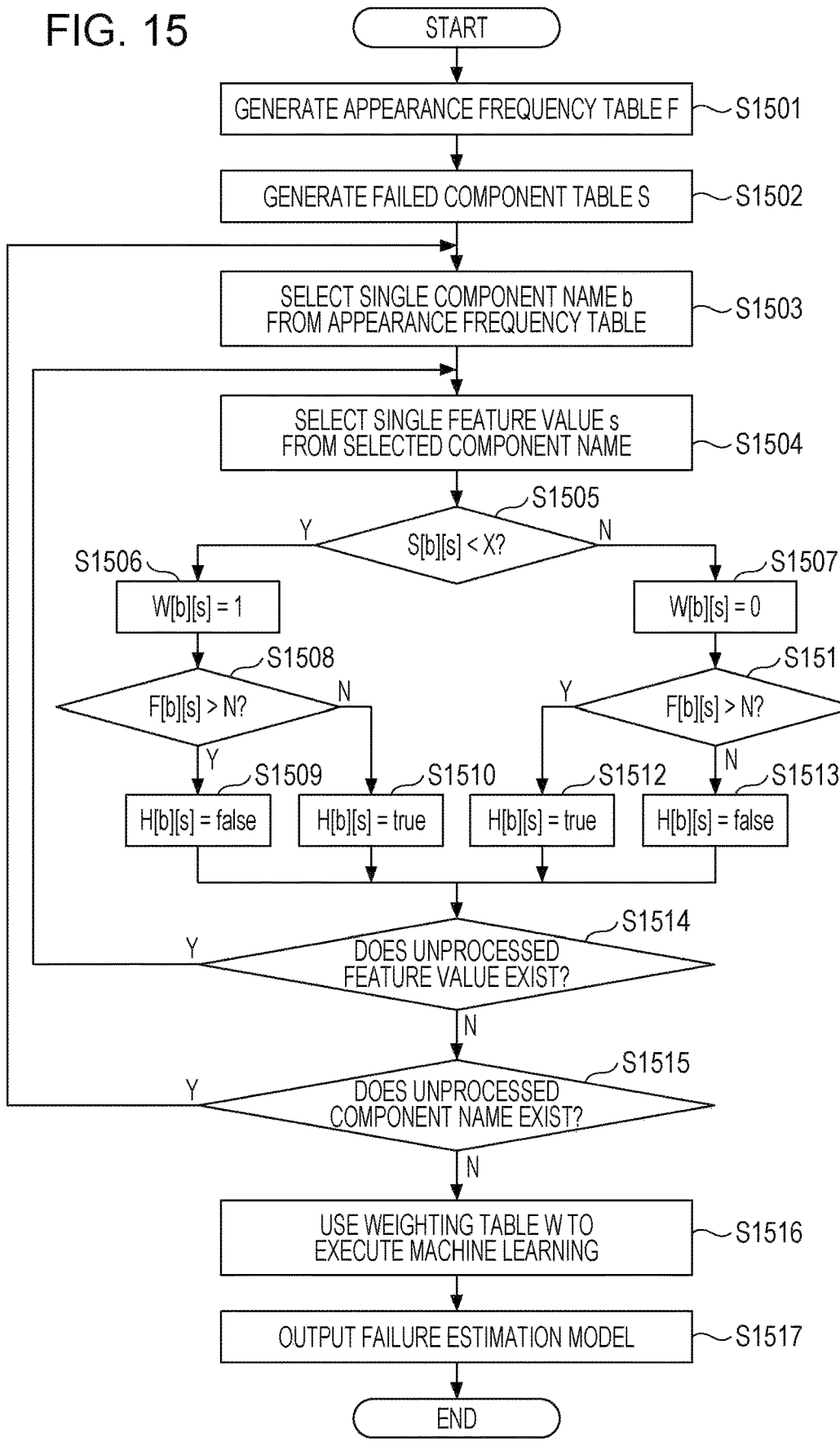
FIG. 15 is a flowchart illustrating operations of an information processing device according to the second embodiment.

A process to be executed by the failure rate estimation processing section 250A according to the second embodiment is described below with reference to FIG. 15. FIG. 15 is a flowchart illustrating operations of an information processing device according to the second embodiment.

Processes of steps S1501 to S1507 illustrated in FIG. 15 are the same as or similar to the processes of steps S1001 to S1007 illustrated in FIG. 10 and will not be described in detail.

When the weight determiner 255 sets the value of the feature value "s" of the component name "b" to "1" in the weighting table W in step S1506, the hint generator 270 determines whether the value of the feature value "s" of the component name "b" is larger than a threshold N in the appearance frequency table F (in step S1508). The threshold N is an average of values corresponding to all feature values indicated in the appearance frequency table 261. The hint generator 270 according to the second embodiment may calculate and hold the threshold N in advance.

When the concerned value is larger than the threshold N in step S1508, the hint generator 270 sets the value of the feature value "s" of the component name "b" to "false (0)" in the hint table 264 (in step S1509). Then, the hint generator 270 causes the process to proceed to step S1514 described later. In FIG. 15, the hint table 264 is indicated by H.

In this case, the setting of the value of the feature value "s" of the component name "b" to "0" in the hint table 264 indicates that the frequency at which the feature value appears as a search key is higher than the average and is significantly different among feature values of an actually failed component.

A person in charge may have an interest in the feature value and try to acquire information of the feature value, and the feature value is likely to have a relationship with an actual failure. It indicates that the person in charge has knowledge that matches a result of the machine learning executed based on the failure record database 230.

When the concerned value is equal to or smaller than the threshold N in step S1508, the hint generator 270 sets the value of the feature value "s" of the component name "b" to "true (1)" in the hint table 264 (in step S1510). Then, the hint generator 270 causes the process to proceed to step S1514 described later.

In this case, the setting of the value of the feature value "s" of the component name "b" to "1" in the hint table 264 indicates that the feature value appears as the search key at a lower frequency than the average but is significantly different among the feature values of the actually failed component.

Thus, the person in charge may not have an interest in the feature value very much, but the feature value is likely to have a relationship with an actual failure. It indicates that the person in charge has knowledge that does not match the result of executing the machine learning based on the failure record database 230.

When the weight determiner 255 sets the value of the feature value "s" of the component name "b" to "0" in the weighting table W in step S1507, the hint generator 270 determines whether the value of the feature value "s" of the component name "b" is larger than the threshold N in the appearance frequency table F (in step S1511).

When the concerned value is larger than the threshold N in step S1511, the hint generator 270 sets the value of the feature value "s" of the component name "b" to "true (1)" in the hint table 264 (in step S1512). Then, the hint generator 270 causes the process to proceed to step S1514 described later.

In this case, the setting of the value of the feature value "s" of the component name "b" to "1" in the hint table 264 indicates that the feature value appears as the search key at a higher frequency than the average but is not significantly different among the feature values of the actual failed component.

Thus, the person in charge may have an interest in the feature value and try to acquire information of the feature, but the feature value is not likely to have a relationship with an actual failure. It indicates that the person in charge has knowledge that does not match the result of executing the machine learning based on the failure record database 230.

When the concerned value is equal to or smaller than the threshold N in step S1511, the hint generator 270 sets the value of the feature value "s" of the component name "b" to "false (0)" in the hint table 264 (in step S1513). Then, the hint generator 270 causes the process to proceed to step S1514 described later.

In this case, the setting of the value of the feature value "s" of the component name "b" to "0" in the hint table 264 indicates that the feature value appears as the search key at a lower frequency than the average and is not significantly different among the feature values of the actually failed component.

Thus, the person in charge may not have an interest in the feature value and not try to acquire information of the feature value, and the feature value is not likely to have a relationship with an actual failure. It indicates that the person in charge has knowledge that matches the result of executing the machine learning based on the failure record database 230.

Processes of steps S1514 to S1517 illustrated in FIG. 15 are the same as or similar to the processes of steps S1008 to S1011 illustrated in FIG. 10 and will not be described in detail.

The hint table 264 is described below in detail with reference to FIG. 16. FIG. 16 is a diagram illustrating an example of the hint table according to the second embodiment.

Information items included in the hint table 264 according to the second embodiment are a component name item and feature value items associated with the component name item. In the hint table 264, each of component names indicated in the component name item is associated with feature values indicated in the feature value items.

For example, when the weight determiner 255 sets the weight of the feature value "material" of the component name "capacitor" to "0" in the weighting table 263 (refer to FIG. 11), the hint generator 270 determines whether a value corresponding to the feature value "material" of the component name "capacitor" is larger than the threshold N in the appearance frequency table 261.

This case assumes that the value corresponding to the feature value "material" of the component name "capacitor" is 50% higher than the threshold N in the appearance frequency table 261 (refer to FIG. 8). In this case, the hint generator 270 sets the value corresponding to the feature value "material" of the component name "capacitor" to "1" in the hint table 264.

It is, therefore, apparent that the feature value "material" of the component name "capacitor" appears as a search key at a high frequency but is not likely to have a relationship with an actual failure.

In addition, for example, when the weight determiner 255 sets the weight of the feature value "terminal electrode" of the component name "capacitor" to "1" in the weighting table 263 (refer to FIG. 11), the hint generator 270 determines whether a value corresponding to the feature value "terminal electrode" of the component name "capacitor" is larger than the threshold N in the appearance frequency table 261.

This case assumes that the value corresponding to the feature value "terminal electrode" of the component name "capacitor" is 50% higher than the threshold N in the appearance frequency table 261 (refer to FIG. 8). In this case, the hint generator 270 sets the value corresponding to the feature value "terminal electrode" of the component name "capacitor" to "0" in the hint table 264. It is, therefore, apparent that the feature value "terminal electrode" of the component name "capacitor" appears as a search key at a high frequency and has a relationship with an actual failure.

For example, when the weight determiner 255 sets a weight of the feature value "withstand voltage" of the component name "crystal oscillator" to "0" in the weighting table 263 (refer to FIG. 11), the hint generator 270 determines whether a value corresponding to the feature value "withstand voltage" of the component name "crystal oscillator" is larger than the threshold N in the appearance frequency table 261.

In this case, the value corresponding to the feature value "withstand voltage" of the component name "crystal oscillator" is 100% and higher than the threshold N in the appearance frequency table 261 (refer to FIG. 8). In this case, the hint generator 270 sets the value corresponding to the feature value "withstand voltage" of the component name "crystal oscillator" to "1" in the hint table 264. It is, therefore, apparent that the feature value "withstand voltage" of the component name "crystal oscillator" appears as a search key at a high frequency but is not likely to have a relationship with an actual failure.

The hint generator 270 associates, in the hint table 264, supplementary information (hint) indicating the aforementioned details with a feature value of a component, which is set to "1". The output section 258 causes the terminal device 300 to display results of the weighting and the supplementary information.

An example of the output from the output section 258 according to the second embodiment is described below with reference to FIGS. 17 and 18. FIG. 17 is a first diagram illustrating an example of the output of the hint according to the second embodiment.

A screen 171 illustrated in FIG. 17 is an example of a screen displayed in the terminal device 300. On the screen 171, information 172, information 173, and a button 174 are displayed. The information 172 indicates a component name and weights assigned to feature values that are associated with the component name. The information 173 indicates supplementary information (hint) on weighting.

The information 172 displayed on the screen 171 indicates results of weighting of the feature values of the component name "capacitor". The component name for which the results of the weighting are displayed as the information 172 may be extracted, for example, by inputting information specifying the component from the terminal device 300.

In the information 172, a feature value associated with the supplementary information is highlighted. In other words, in the information 172, the feature value that is set to "1", among the feature values associated with the component name "capacitor" in the hint table 264, is highlighted.

In the example illustrated in FIG. 17, the feature value "material" is highlighted. In the second embodiment, for example, when the feature value "material" is selected in the terminal device 300, the output section 258 causes the terminal device 300 to display the supplementary information 173 generated by the hint generator 270 and associated with the feature value "material".

The generation of the supplementary information by the hint generator 270 is described below. The hint generator 270 according to the second embodiment identifies a feature value set to "1" in the hint table 264. Then, the hint generator 270 references the value corresponding to the feature value associated with the component name in each of the appearance frequency table 261 and the weighting table 263. Then, the hint generator 270 generates supplementary information (described later) from an appearance frequency of the feature value of the component in the appearance frequency table 261 and a weight of the feature value of the component in the weighting table 263.

Thus, the supplementary information according to the second embodiment indicates a relationship between the appearance frequency of the feature value of the component and information indicating whether each of feature values associated with the name of a failed component is significantly different.

In the example illustrated in FIG. 17, the supplementary information 173 is associated with the feature value "material" of the component name "capacitor". In this case, it is apparent from an appearance frequency of the feature value "material" of the component name "capacitor" in the appearance frequency table 261 and the weight of the feature value "material" of the component name "capacitor" in the weighting table 263 that the feature value "material" of the component name "capacitor" appears as a search key at a high frequency but is not likely to have a relationship with an actual failure.

Thus, the hint generator 270 generates, as supplementary information indicating that effect, a message indicating that "you have often performed a search using this feature value, but this feature value is less relevant to a failure". Then, the output section 258 causes the terminal device 300 to display the generated message.

The hint generator 270 according to the second embodiment may hold, as text data, a message output as supplementary information for each of combinations of appearance frequencies as search keys and weights.

In the second embodiment, when the button 174 is operated on the screen 171, the failure estimation model 280 that has received the weights indicated by the information 172 and has been rebuilt may cause the screen 171 to transition to the screen (refer to FIG. 13) for displaying the obtained failure rate.

Figure 18:
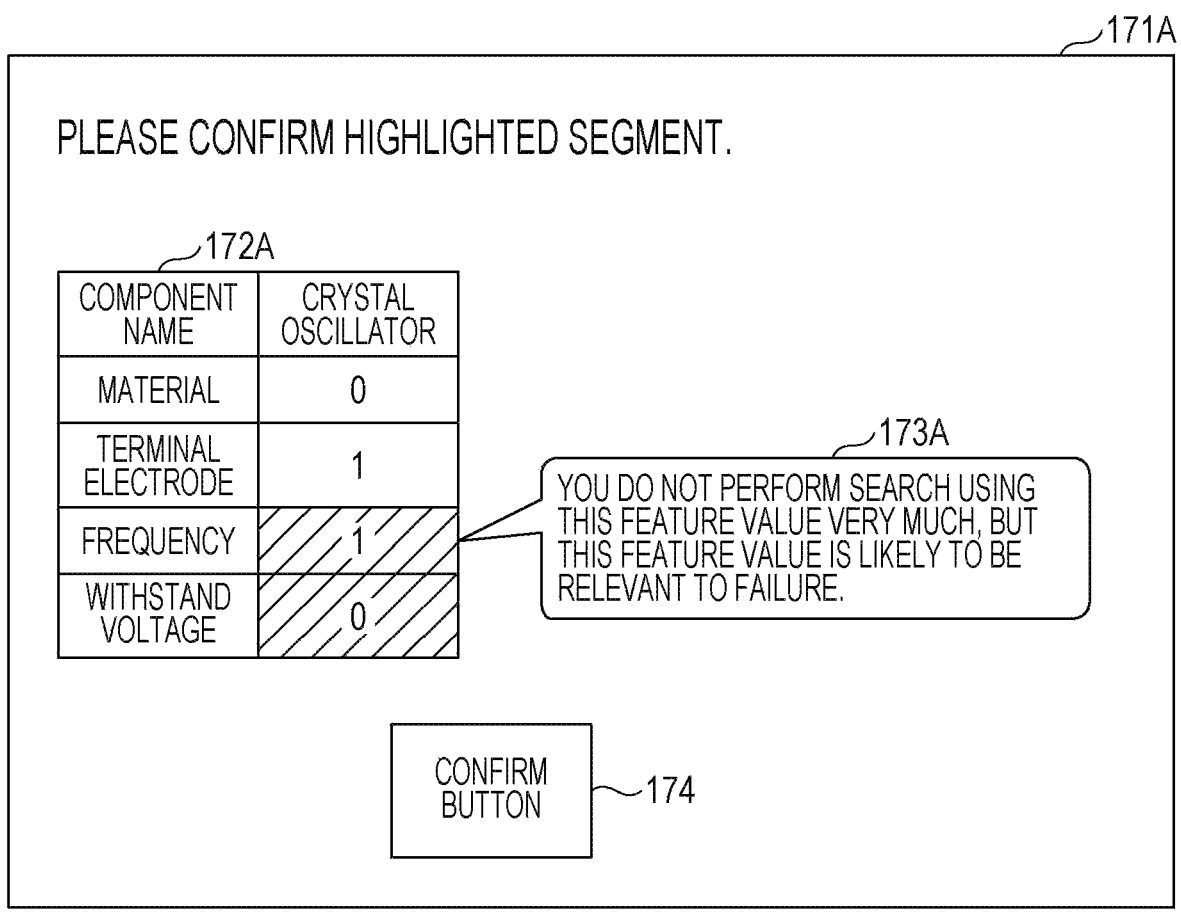
FIG. 18 is a second diagram illustrating an example of output of a hint according to the second embodiment.

FIG. 18 is a second diagram illustrating an example of output of a hint according to the second embodiment. On a screen 171A illustrated in FIG. 18, information 172A, information 173A, and a button 174 are displayed. The information 172A indicates a component name and weights assigned to feature values associated with the component name. The information 173A indicates supplementary information on weighting.

In the example illustrated in FIG. 18, the information 172A indicates results of weighting of the feature values of the component name "crystal oscillator". In the example illustrated in FIG. 18, it is apparent that, among the feature values indicated by the information 172A, the feature value "frequency" and the feature value "withstand voltage" are highlighted, and that the supplementary information is associated with the feature values "frequency" and "withstand voltage".

When the feature value "frequency" is selected on the screen 171A, the supplementary information 173A is displayed. The supplementary information 173A is a message indicating that "you do not perform a search using this feature value very much, but this feature value is likely to be relevant to a failure".

As described above, according to the second embodiment, weighting results may be browsed by a person in charge of selecting components. According to the second embodiment, when whether the person in charge has an interest in a feature value does not match information indicating whether the feature value has a relationship with an actual failure, that effect may be notified to the person in charge.

Information indicating a failure rate of a specified component may be displayed on each of the screens illustrated in FIGS. 17 and 18.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer-readable recording medium having stored therein a program that causes a computer to execute a process, the process comprising:
   generating, based on search history information indicating history of search in a component search device with respect to feature values of a component, appearance frequency information indicating frequencies at which the feature values appear in the search history information;
   generating, based on the appearance frequency information, weighting information in which weights are associated with the feature values;
   executing learning on accumulated failure record information to build a failure estimation model for estimating a failure rate of the component and to rebuild the failure estimation model for estimating the failure rate of the component based on weights associated with unprocessed feature values; and
   estimating the failure rate of the component by using the failure estimation model.

2. The non-transitory computer-readable recording medium according to claim 1, the process further comprising:
   generating, based on the appearance frequency information and the weighting information, supplementary information in accordance with combinations of the appearance frequencies and the weights of the feature values; and
   outputting the weighting information and the supplementary information.

3. The non-transitory computer-readable recording medium according to claim 2, the process further comprising:
   associating the supplementary information with a feature value which appears at a frequency higher than a predetermined threshold and to which a weight is not assigned; and
   associating the supplementary information with a feature value which appears at a frequency lower than the predetermined threshold and to which a weight is assigned.

4. The non-transitory computer-readable recording medium according to claim 2, wherein
   the supplementary information indicates relationships between the appearance frequencies of the feature values and information indicating whether each of the feature values has a statistically significant difference.

5. The non-transitory computer-readable recording medium according to claim 1, the process further comprising:
   generating, based on the accumulated failure record information, failed component information indicating results of evaluating whether each of the feature values of the failed component has a statistically significant difference; and
   generating the weighting information based on the appearance frequency information and the failed component information.

6. A method for estimating a failure rate, the method comprising:
   generating by a computer, based on search history information indicating history of search in a component search device with respect to feature values of a component, appearance frequency information indicating frequencies at which the feature values appear in the search history information;
   generating, based on the appearance frequency information, weighting information in which weights are associated with the feature values;
   executing learning on accumulated failure record information to build a failure estimation model for estimating a failure rate of the component and to rebuild the failure estimation model for estimating the failure rate of the component based on weights associated with unprocessed feature values; and
   estimating the failure rate of the component by using the failure estimation model.

7. An information processing device, comprising:
   a memory; and
   a processor coupled to the memory and the processor configured to:
      generate, based on search history information indicating history of search in a component search device with respect to feature values of a component, appearance frequency information indicating frequencies at which the feature values appear in the search history information;
      generate, based on the appearance frequency information, weighting information in which weights are associated with the feature values;
      execute learning on accumulated failure record information to build a failure estimation model for estimating a failure rate of the component and to rebuild the failure estimation model for estimating the failure rate of the component based on weights associated with unprocessed feature values; and
      estimate the failure rate of the component by using the failure estimation model.

* * * * *